(12) United States Patent
Dargis et al.

(10) Patent No.: US 8,394,194 B1
(45) Date of Patent: Mar. 12, 2013

(54) SINGLE CRYSTAL REO BUFFER ON AMORPHOUS $SIO_x$

(76) Inventors: Rytis Dargis, Fremont, CA (US);
Andrew Clark, Los Altos, CA (US);
Robin Smith, Palo Alto, CA (US);
Michael Lebby, Apanche Junction, AZ (US)

( * ) Notice: Subject to any disclaimer, the term of this patent is extended or adjusted under 35 U.S.C. 154(b) by 0 days.

(21) Appl. No.: 13/495,215

(22) Filed: Jun. 13, 2012

(51) Int. Cl.
*C30B 1/02* (2006.01)
*H01L 23/58* (2006.01)

(52) U.S. Cl. ............ 117/4; 117/7; 117/9; 438/478; 438/479; 438/486; 438/584; 438/655; 438/682

(58) Field of Classification Search .......... 117/4, 7, 117/9; 438/478, 479, 486, 584, 682, 655
See application file for complete search history.

(56) References Cited

U.S. PATENT DOCUMENTS

| | | | | |
|---|---|---|---|---|
| 4,394,673 A | * | 7/1983 | Thompson et al. | 257/478 |
| 7,355,269 B1 | * | 4/2008 | Lebby et al. | 257/644 |
| 2006/0246691 A1 | * | 11/2006 | Atanackovic et al. | 438/479 |

* cited by examiner

*Primary Examiner* — Matthew Song
(74) *Attorney, Agent, or Firm* — Parsons & Goltry; Robert A. Parsons; Michael W. Goltry

(57) ABSTRACT

A method of forming a layer of amorphous silicon oxide positioned between a layer of rare earth oxide and a silicon substrate. The method includes providing a crystalline silicon substrate and depositing a layer of rare earth metal on the silicon substrate in an oxygen deficient ambient at a temperature above approximately 500° C. The rare earth metal forms a layer of rare earth silicide on the substrate. A first layer of rare earth oxide is deposited on the layer of rare earth silicide with a structure and lattice constant substantially similar to the substrate. The structure is annealed in an oxygen ambience to transform the layer of rare earth silicide to a layer of amorphous silicon and an intermediate layer of rare earth oxide between the substrate and the first layer of rare earth oxide.

9 Claims, 3 Drawing Sheets

SINGLE CRYSTAL REO BUFFER ON AMORPHOUS SIO$_x$

FIELD OF THE INVENTION

This invention relates in general to the formation of amorphous silicon oxide on silicon wafers between the substrate and a single-crystal rare earth oxide buffer for the growth of III-N semiconductor material.

BACKGROUND OF THE INVENTION

It has been found that III-N materials are a desirable semiconductor material in many electronic and photonic applications. As understood in the art, the III-N semiconductor material must be provided as a crystalline or single-crystal formation for the most efficient and useful bases for the fabrication of various electronic and photonic devices therein. Further, the single-crystal III-N semiconductor material is most conveniently formed on single-crystal silicon wafers because of the extensive background and technology developed in the silicon semiconductor industry. However, the crystal lattice constant mismatch between silicon and a III-N material, such as GaN, is 17% if grown c-axis on (111) oriented silicon.

Also, the thermal expansion difference between the III-N material, such as GaN, is 56%. Both of these factors lead to residual stress and consequently to structural defects and mechanical damage (e.g. cracks) in the structure.

A buffer layer between the silicon substrate and the III-N layer that could absorb stress would help solve the problem. Several copending patent applications have been filed in the U.S. in which rare earth oxides were grown on a silicon substrate to serve as a stress engineered buffer layer for the subsequent growth of III-N semiconductor material. Two of these copending U.S. patent applications are: Strain Compensated REO Buffer for III-N on Silicon, filed 21 Oct. 2011, bearing Ser. No. 13/278,952; and Nucleation of III-N on REO Templates, filed 20 Mar. 2012, bearing Ser. No. 61/613,289, both of which are included herein by reference.

While the rare earth oxide (REO) stress engineered buffer layers can reduce stress to a manageable level the stress can be conveniently reduced or substantially eliminated by including a layer of amorphous silicon oxide between the silicon substrate and the rare earth oxide buffer. Silicon oxide is amorphous material and has low viscosity at temperatures above 500° C. that results in stress relaxation, critical from the point of view of thermal stress during cooling down of GaN (III-N material) on silicon heterostructure. A major problem is that the formation of the amorphous silicon oxide layer must take place during the growth of the single-crystal REO buffer because growth of the REO on an amorphous silicon layer would lead to a polycrystalline REO buffer which is not suitable for single-crystal III-N growth.

There are potentially several ways to form the silicon oxide interface layer all of which have severe drawbacks. In a first method, an atmosphere of excess oxygen can be provided during the REO growth. Some problems with this method are that high oxygen pressure is needed during the process which causes the lifetime of the MBE components in the chamber to deteriorate and the SiO$_x$ layer is not thick enough to adequately perform the stress relief. In a second method, the REO is grown and the structure is subsequently annealed in oxygen atmosphere. A method of this type is described in U.S. Pat. No. 7,785,706, entitled "Semiconductor Wafer and Process for its Production", issued Aug. 31, 2010 and U.S. Pub. 2010/0221869 of the same title. One problem with this type of method is that the formation of the interface can be hard to control, the oxidation needs long time, temperature and/or high oxygen pressure because oxidation of silicon is diffusion limited process, which means that oxidation becomes slower with increasing of thickness of the silicon dioxide layer.

It would be highly advantageous, therefore, to remedy the foregoing and other deficiencies inherent in the prior art.

Accordingly, it is an object of the present invention to provide new and improved methods of forming a layer of amorphous silicon between a REO buffer and a silicon substrate.

It is another object of the present invention to provide new and improved methods of forming a layer of amorphous silicon dioxide between a REO buffer and a silicon substrate that is sufficiently thick to adequately perform stress relief that is easy and reliable to control.

It is another object of the present invention to provide a new and improved III-N semiconductor layer on a silicon substrate including a layer of amorphous silicon between a REO buffer and the substrate.

SUMMARY OF THE INVENTION

Briefly, the desired objects and aspects of the instant invention are achieved in accordance with a preferred method of forming a layer of amorphous silicon oxide positioned between a layer of rare earth oxide and a silicon substrate. The method includes providing a crystalline silicon substrate and depositing a layer of rare earth metal on the silicon substrate in an oxygen deficient ambient at a temperature above approximately 500° C. The rare earth metal forms a layer of rare earth silicide on the substrate. A first layer of rare earth oxide is deposited on the layer of rare earth silicide with a structure and lattice constant substantially similar to the substrate. The structure is annealed in an oxygen ambience to transform the layer of rare earth silicide to a layer of amorphous silicon and an intermediate layer of rare earth oxide between the substrate and the first layer of rare earth oxide.

The desired objects and aspects of the instant invention are further realized in accordance with a preferred embodiment of a crystalline silicon substrate including a layer of rare earth metal deposited on the silicon substrate in an oxygen deficient ambient at a temperature above approximately 500° C. The rare earth metal forms a layer of rare earth silicide on the substrate. The layer of rare earth silicide is transformed by annealing into a layer of amorphous silicon and an intermediate layer of rare earth oxide positioned between the substrate and the first layer of rare earth oxide. A first layer of rare earth oxide is deposited on the layer of rare earth silicide with a structure and lattice constant substantially similar to the substrate.

The preferred embodiment can further include a second layer of rare earth oxide with a structure and lattice constant substantially similar to the substrate. The second layer of rare earth oxide is positioned on the first layer of rare earth oxide to form a template for the subsequent deposition of a III-N semiconductor material. The preferred embodiment can further include a layer of III-N semiconductor material positioned on the second layer of rare earth oxide. The III-N semiconductor material has a structure and lattice constant substantially similar to the substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

In view of the need for stress relaxation in a process of forming III-N semiconductor layers on silicon substrates some effort and study has gone into the formation of an amorphous layer of silicon oxide ($SiO_x$) between the silicon substrate and the III-N layer or layers. However, to date various proposed methods for the formation of the amorphous layer all have several drawbacks or problems that substantially reduce the efficiency or effectiveness of the process and results. Accordingly, a new method for the formation of an amorphous layer of silicon oxide ($SiO_x$) between the silicon substrate and the III-N layer or layers is herein disclosed. The new method is greatly improved and results in the formation of an amorphous layer that can be accurately controlled and which substantially absorbs or reduces stress between the silicon substrate and the III-N semiconductor layer.

Figure 1:
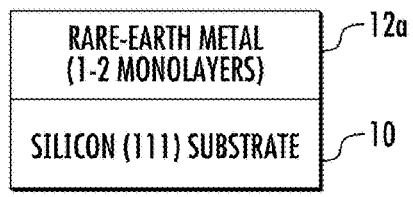
FIGS. 1-5 are simplified layer diagrams illustrating several sequential steps in a process of the formation of amorphous silicon oxide on silicon wafers between a substrate and a single-crystal rare earth oxide buffer for the growth of III-N semiconductor material in accordance with the present invention.

Turning now to FIG. 1, a silicon substrate 10 is illustrated which is, as understood in the art, a single-crystal material including silicon and may in some applications include other materials all of which are included in the general term "silicon" substrate. Also, the substrate may be for example a silicon wafer or some part thereof and is referred to herein by the general term "substrate". While silicon substrate 10 is illustrated as having a <111> crystal orientation, it will be understood, is not limited to any specific crystal orientation but could include <111> silicon, <110> silicon, <100> silicon or any other orientation or variation known and used in the art.

A very thin layer 12a of rare earth metal is deposited on the surface of silicon substrate 10. Rare earth metal layer 12a is grown directly on the surface of substrate 10 using any of the well-known growth methods, such as MBE, MOCVD, PLD (pulsed laser deposition), sputtering, ALD (atomic layer deposition), or any other known growth method for thin films. Throughout this disclosure whenever rare earth materials are mentioned it will be understood that "rare earth" materials are generally defined as any of the lanthanides as well as scandium and yttrium. Metal layer 12a is grown 1-2 monolayers thick which is about 0.5 nm to about 1.0 nm thick. The typical growth temperature for the rare earth metal is above approximately 550° C.

Figure 2:
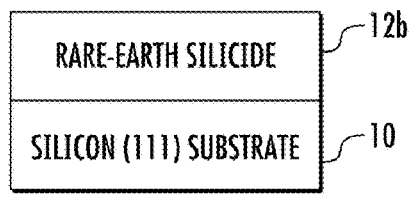

As illustrated in FIG. 2, rare earth metal layer 12a at the typical growth temperatures in an oxygen deficient ambience transforms to silicide (layer 12b) during reaction with silicon atoms in substrate 10. For convenience of understanding layer 12 is designated with different letter designations (i.e. a, b, c) to show the changes that occur. It is important to keep layer 12b very thin so that the following single-crystal growth steps can be performed. Thin silicide layer 12b is epitaxially stabilized to silicon substrate 10 so that the crystalline structure is similar to silicon and has a similar lattice constant. As an example, some gadolinium silicides have a very close structure with silicon. By starting growth of metal layer 12a with a lower oxygen pressure (oxide deficient condition) initial oxidation of the silicide is prevented which leads to the formation of a thicker silicide layer 12b.

Figure 3:
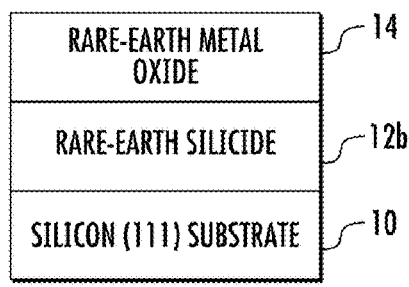

Referring to FIG. 3, it will be understood that for convenience and efficiency of procedure the growth process from FIG. 2 is continued (i.e. in situ). In the step illustrated in FIG. 3, oxygen is introduced into the process and growth of a single-crystal rare earth oxide (REO) layer 14 is accomplished. Because silicide layer 12b is very thin REO layer 14 has the atom stacking sequence from the silicon substrate, that is REO layer 14 and substrate 10 have a similar crystalline structure and a similar lattice constant. REO layer 14 is grown with a thickness from several nanometers (3 nm or less) to 10 nm or more, depending on the subsequent annealing time. Primarily, REO layer 14 is grown thin enough to promote oxygen diffusion through layer 14.

Figure 4:
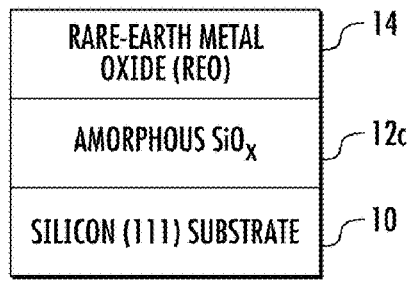

Referring to FIG. 4, after the growth of REO layer 14 the structure is annealed preferably at approximately 900° C. in an oxygen ambience for oxide diffusion to the interface between silicide layer 12b and REO layer 14. Silicide layer 12b is transformed to a rare earth silicate and ultimately to rare earth oxide because rare earth metals are strong reducers. During this process excessive oxygen in cooperation with the silicon in silicide layer 12b forms a layer 12c of amorphous silicon oxide at the interface with substrate 10. Thus, silicide layer 12b is essentially reduced to a thin layer 12c of amorphous silicon oxide and a thin layer of rare earth oxide (illustrated in FIG. 4 as part of layer 14.

Figure 7:
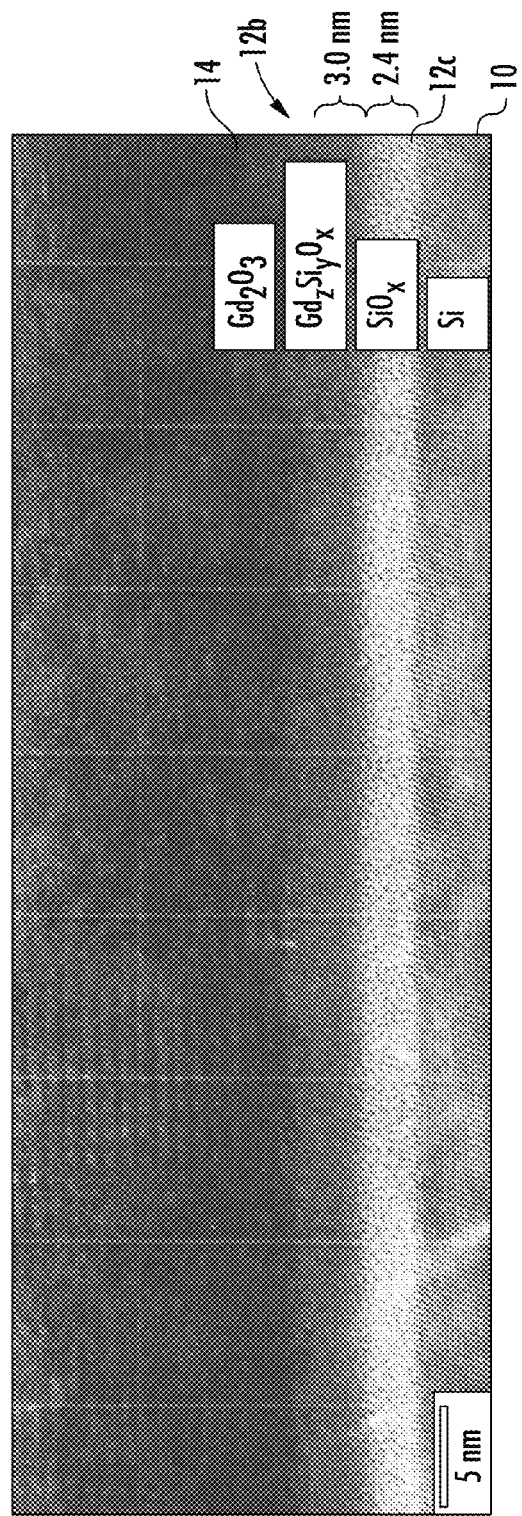
FIG. 7 is a pictorial view of a REO layer grown on an amorphous silicon oxide on a silicon wafer, in accordance with the present invention.

Referring additionally to FIG. 7, in the pictorial view the REO silicide layer 12b includes gadolinium silicide as an example. As can be seen from the pictorial, after the annealing layer described above, the gadolinium silicide is reduced to a thin amorphous layer of $SiO_x$ and a thin $Gd_zSi_yO_x$ layer. The silicide layer 12b is not stable because both Si and Gd have a very high affinity to oxygen. Thus, it is substantially easier to transform the silicide of layer 12b to amorphous silicate and silicon dioxide than to transform the silicon of substrate 10 to silicon dioxide. The silicide transforms easier than the substrate silicon because oxidation of silicon is a diffusion limited process (i.e. the oxidation rate slows with the oxide thickness) and requires higher temperatures and oxygen pressures when compared to the present silicide reduction process.

Figure 5:
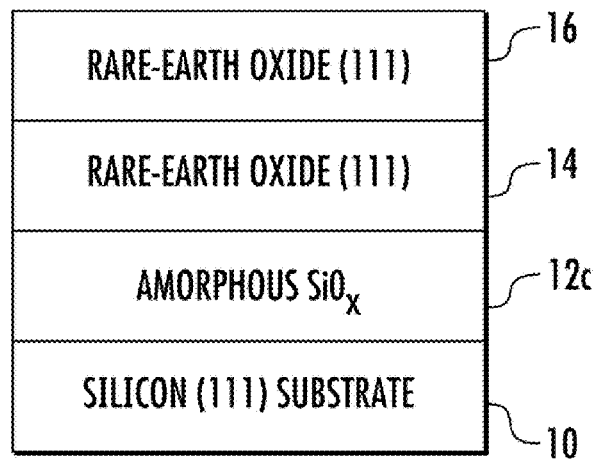

In a subsequent step illustrated in FIG. 5, a thicker layer 16 of rare earth oxide (REO) is grown on REO layer 14. REO layer 16 is preferably grown to a thickness in a range from less than approximately 50 nm to greater than approximately 500 nm so as to serve as a template for the subsequent growth of a III-N semiconductor layer. REO templates are disclosed in more detail in the copending patent applications described above and included herein by reference.

Figure 6:
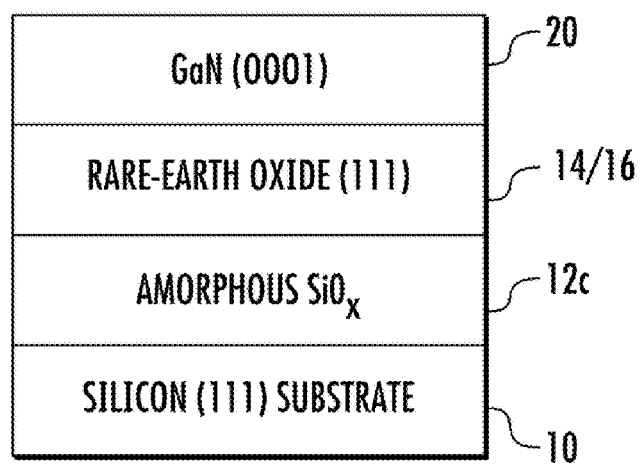
FIG. 6 illustrates a final step in which a III-N layer of semiconductor material is grown on a single-crystal rare earth oxide buffer.

Turning to FIG. 6 a final step in the process of the growth of III-N semiconductor material on a silicon substrate is illustrated. It will of course be understood that this is simply described as a final step because a layer 20 of III-N semiconductor material (in this example GaN) is grown on the REO template 14/16. Once layer 20 is grown additional steps in a process of fabricating a semiconductor product (e.g. photonic device, sensor, etc.) can be performed. As explained above, layer 12c of amorphous silicon oxide has low viscosity at temperatures above 500° C. that results in stress relaxation, which is critical in point of view of thermal stress during cooling down of III-N on Si heterostructure.

Thus, the silicide of layer 12b is transformed to amorphous silicate and silicon dioxide rather than attempting to transform the silicon of substrate 10 to silicon dioxide as in prior art methods. The present novel method is relatively easy to perform and results in a substantially uniform layer of amorphous silicon oxide that is sufficiently thick to provide the desired stress relief during the cool down of a III-N semiconductor layer of material deposited on the REO template.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of forming a layer of amorphous silicon oxide between a layer of rare earth oxide and a silicon substrate, the method comprising the steps of:
   providing a crystalline silicon substrate;
   depositing a layer of rare earth metal on the silicon substrate in an oxygen deficient ambient at a temperature above approximately 500° C., the rare earth metal forming a layer of rare earth silicide on the substrate;
   depositing a first layer of rare earth oxide on the layer of rare earth silicide with a structure and lattice constant substantially similar to the substrate; and
   annealing the structure in an oxygen ambience to transform the layer of rare earth silicide to a layer of amorphous silicon and an intermediate layer of rare earth oxide between the substrate and the first layer of rare earth oxide.

2. A method as claimed in claim 1 wherein the layer of rare earth metal is deposited with a thickness of 1-2 monolayers.

3. A method as claimed in claim 1 wherein the first layer of rare earth oxide is deposited with a thickness in a range of 3 nm to 10 nm.

4. A method as claimed in claim 1 wherein the annealing step is performed at a temperature of approximately 900° C.

5. A method of fabricating a layer of single-crystal semiconductor material on a silicon substrate comprising the steps of:
   providing a crystalline silicon substrate;
   depositing a layer of rare earth metal on the silicon substrate in an oxygen deficient ambient at a temperature above approximately 500° C., the rare earth metal forming a layer of rare earth silicide on the substrate;
   depositing a first layer of rare earth oxide on the layer of rare earth silicide with a structure and lattice constant substantially similar to the substrate;
   annealing the structure in an oxygen ambience to transform the layer of rare earth silicide to a layer of amorphous silicon and an intermediate layer of rare earth oxide;
   depositing a second layer of rare earth oxide with a structure and lattice constant substantially similar to the substrate on the first layer of rare earth oxide to form a template for the subsequent deposition of a III-N semiconductor material; and
   depositing a layer of III-N semiconductor material on the second layer of rare earth oxide, the III-N semiconductor material having a structure and lattice constant substantially similar to the substrate.

6. A method as claimed in claim 5 wherein the layer of rare earth metal is deposited with a thickness of 1-2 monolayers.

7. A method as claimed in claim 5 wherein the first layer of rare earth oxide is deposited with a thickness in a range of 3 nm to 10 nm.

8. A method as claimed in claim 5 wherein the annealing step is performed at a temperature of approximately 900° C.

9. A method as claimed in claim 5 wherein the second layer of rare earth oxide is deposited with a thickness in a range of 50 nm to 500 nm.

\* \* \* \* \*